(12) United States Patent
Cai

(10) Patent No.: US 10,718,834 B2
(45) Date of Patent: Jul. 21, 2020

(54) GRADIENT AMPLIFIER AND DRIVE CIRCUIT THEREOF

(71) Applicant: Shanghai Neusoft Medical Technology Co., Ltd., Shanghai (CN)

(72) Inventor: Dongri Cai, Shanghai (CN)

(73) Assignee: Shanghai Neusoft Medical Technology Co., Ltd., Shanghai (CN)

( * ) Notice: Subject to any disclaimer, the term of this patent is extended or adjusted under 35 U.S.C. 154(b) by 333 days.

(21) Appl. No.: 15/880,038

(22) Filed: Jan. 25, 2018

(65) Prior Publication Data

US 2018/0210048 A1 Jul. 26, 2018

(30) Foreign Application Priority Data

Jan. 25, 2017 (CN) .......................... 2017 1 0060847

(51) Int. Cl.
*G01R 33/385* (2006.01)
*H03F 3/30* (2006.01)
*G01R 33/24* (2006.01)
*H03F 3/217* (2006.01)

(52) U.S. Cl.
CPC ....... *G01R 33/3852* (2013.01); *G01R 33/246* (2013.01); *H03F 3/2173* (2013.01); *H03F 3/3081* (2013.01); *H03F 2200/351* (2013.01)

(58) Field of Classification Search
CPC . G01R 33/3852; G01R 33/246; H03F 3/2173; H03F 3/3081; H03F 2200/351
See application file for complete search history.

(56) References Cited

U.S. PATENT DOCUMENTS

| 6,166,602 A | * | 12/2000 | Steigerwald | .......... | H03F 3/2178 |
| | | | | | 327/124 |
| 2017/0234950 A1 | * | 8/2017 | Lenz | .................. | G01R 33/3852 |
| | | | | | 324/322 |

FOREIGN PATENT DOCUMENTS

| CN | 1745315 A | 3/2006 |
| CN | 103076580 A | 5/2013 |
| CN | 203275625 U | 11/2013 |
| CN | 104142483 A | 11/2014 |
| CN | 105785295 A | 7/2016 |

(Continued)

OTHER PUBLICATIONS

State Intellectual Property Office of the People's Republic of China, Office Action and Search Report Issued in Application No. 201710060847.2, Nov. 2, 2018, 14 pages, (Submitted with Machine Translation).

(Continued)

*Primary Examiner* — Patrick Assouad
*Assistant Examiner* — Haidong Zhang
(74) *Attorney, Agent, or Firm* — Fish & Richardson P.C.

(57) ABSTRACT

A gradient amplifier includes N working half-bridge groups. In each of the working half-bridge groups, a first working half-bridge includes a first switch and a second switch, and a second working half-bridge includes a third switch and a fourth switch. An emitter of the first switch is coupled with a collector of the second switch at a first coupling point, and an emitter of the third switch is coupled with a collector of the fourth switch at a second coupling point. A gradient coil is coupled between the first coupling point and the second coupling point in each of the working half-bridge groups, and a current flowing through the gradient coil is a sum of currents flowing through the N working half-bridge groups.

18 Claims, 10 Drawing Sheets

(56) References Cited

FOREIGN PATENT DOCUMENTS

| CN | 106226714 | A  |   | 12/2016 |
|----|-----------|----|---|---------|
| JP | 3588169   | B2 | * | 11/2004 |
| JP | 3588169   | B2 |   | 11/2004 |

OTHER PUBLICATIONS

Stean Linder, Source-drain diode (body diode), Power Semiconductors issued in China Machine Press, May 31, 2016, 6 pages, (Submitted with Partial Translation).

* cited by examiner

GRADIENT AMPLIFIER AND DRIVE CIRCUIT THEREOF

CROSS REFERENCE TO RELATED APPLICATIONS

This application claims priority to Chinese Patent Application No. 201710060847.2, filed on 25, Jan. 2017, the entire content of which is incorporated herein by reference.

TECHNICAL FIELD

The present disclosure relates to a gradient amplifier of a nuclear magnetic resonance imaging (MRI) system, a drive circuit for the gradient amplifier, and a gradient system thereof.

BACKGROUND

An MRI system may include a magnet system, a radio frequency system and a computer system. The magnet system may include a main magnet and a gradient system. The main magnet may include an electromagnet, permanent magnet or superconducting magnet, which is used to provide a uniform and stable static magnetic field for magnetizing a tissue of a subject. The gradient system may include a gradient coil, a gradient waveform generator, a gradient amplifier and the like, which is used to generate gradient magnetic field(s) in X, Y and Z directions. In this way, MRI signal(s) may be spatially encoded to determine a position and a thickness of an imaging plane. The radio frequency system may include a radio frequency generator and a radio frequency receiver, which is used to implement radio frequency excitation and receive and process a radio frequency MRI signal. The computer system may be configured to control pulse excitation and signal acquisition of the MRI system, and perform image reconstruction, display, transmission and storage based on the MRI signal(s).

In the gradient system, the gradient amplifier may be used to supply power to a gradient coil to generate a gradient magnetic field for imaging. The performance of the gradient amplifier may determine rise time, intensity, linearity, stability and so on of the gradient magnetic field and directly affect speed of imaging and quality of a reconstructed image.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides gradient amplifiers of nuclear magnetic resonance imaging (MRI) systems, drive circuits for the gradient amplifiers, and gradient systems thereof.

One aspect of the present disclosure features a gradient amplifier including: N working half-bridge groups, N being an integer greater than 1, where each of the working half-bridge groups includes: a first working half-bridge having a first switch and a second switch, an emitter of the first switch being coupled with a collector of the second switch at a first coupling point; and a second working half-bridge having a third switch and a fourth switch, an emitter of the third switch being coupled with a collector of the fourth switch at a second coupling point. A gradient coil is coupled between the first coupling point and the second coupling point, and each of the working half-bridge groups is configured such that a first current path from a power supply through the first switch, the gradient coil and the fourth switch in succession back to the power supply and a second current path from the power supply through the third switch, the gradient coil and the second switch in succession back to the power supply are formed and a current output from the power supply flows in one of the first current path and the second current path through the gradient coil.

The working half-bridge groups can be configured such that the current paths of the working half-bridge groups are in parallel through the gradient coil, and a current of the gradient coil is a sum of the currents flowing in the current paths through the gradient coil.

The gradient amplifier can further include: for each of the working half-bridge groups, a first inductor coupled between the first coupling point and the gradient coil; and a second inductor coupled between the second coupling point and the gradient coil. The first inductors of adjacent working half-bridge groups of the working half-bridge groups can be configured to couple with each other to obtain first common-mode inductor sets and first differential-mode inductor sets, and the second inductors of the adjacent working half-bridge groups can be configured to couple with each other to obtain second common-mode inductor sets and second differential-mode inductor sets. Each of the common-mode inductor sets is configured to filter out common-mode noise, and each of the differential-mode inductor sets is configured to filter out differential-mode noise.

In some implementations, in each of the working half-bridge groups, respective gates of the first switch and the fourth switch are coupled with a first drive input end to receive a first drive signal, respective gates of the second switch and the third switch are coupled with a second drive input end to receive a second drive signal, and the first drive signal and the second drive signal are configured to alternately turn on the first switch and the fourth switch, and the second switch and the third switch. Respective drive signals of the N working half-bridge groups can be shifted in phase by 360/N degrees in sequence.

In some implementations, the gradient amplifier further includes N freewheeling half-bridge groups, and each of the freewheeling half-bridge groups includes: a first freewheeling half bridge having a fifth switch and a sixth switch, an emitter of the fifth switch being coupled with an emitter of the sixth switch; and a second freewheeling half-bridge having a seventh switch and an eighth switch, an emitter of the seventh switch being coupled with an emitter of the eighth switch. A collector of the fifth switch is coupled with the second coupling point, a collector of the sixth switch is coupled with a collector of the seventh switch, and a collector of the eighth switch is coupled with the first coupling point.

In some examples, in each of the freewheeling half-bridge groups, respective gates of the fifth switch and the seventh switch are coupled with a first freewheeling drive input end to receive a first freewheeling drive signal, respective gates of the sixth switch and the eighth switch are coupled with a second freewheeling drive input end to receive a second freewheeling drive signal, and the first freewheeling drive signal and the second freewheeling drive signal are configured to alternatively turn on the fifth switch and the seventh switch, and the eighth switch and the sixth switch. Respective freewheeling drive signals of the N freewheeling half-bridge groups can be shifted in phase by 360/N degrees in sequence.

Another aspect of the present disclosure features a drive circuit of a gradient amplifier having N working half-bridge groups, N being an integer greater than 1, the drive circuit including: N−1 first phase shifters each configured to perform phase shifting of 360*(i−1)/N degree for an original drive signal to obtain a respective phase-shifted drive signal, i being an integer greater than 1 but no more than N, where the original drive signal is a phase-shifted drive signal with 0 degree phase shift; and N first frequency dividers each configured to divide a frequency of a respective one of the phase-shifted drive signals by N to obtain a respective drive signal for driving at least one switch in a corresponding one of the N working half-bridge groups.

In some implementations, each of the first frequency dividers includes a first PWM circuit configured to: receive a respective phase-shifted drive signal at a signal input end of the first PWM circuit, receive a respective first triangular wave carrier at a carrier input end of the first PWM circuit, and modulate the respective phase-shifted drive signal with the respective first triangular wave carrier to generate the respective drive signal with a frequency equal to 1/N of the frequency of the respective phase-shifted drive signal that is identical to a frequency of the original drive signal.

In some implementations, the gradient amplifier further includes N freewheeling half-bridge groups, and the drive circuit further includes: N−1 second phase shifters each configured to perform phase shifting of 360*(i−1)/N degree for an original freewheeling drive signal to obtain a respective phase-shifted freewheeling drive signal, where the original freewheeling drive signal is a phase-shifted freewheeling drive signal with 0 degree phase shift; and N second frequency dividers each configured to drive a frequency of a respective one of the phase-shifted freewheeling drive signals by N to obtain a respective freewheeling drive signal for driving at least one switch in a corresponding one of the N freewheeling half-bridge groups.

In some examples, each of the second frequency dividers includes a second PWM circuit configured to: receive a respective phase-shifted freewheeling drive signal at a signal input end of the second PWM circuit, receive a respective second triangular wave carrier at a carrier input end of the second PWM circuit, and modulate the respective phase-shifted freewheeling drive signal with the respective second triangular wave carrier to generate the respective freewheeling drive signal with a frequency equal to 1/N of the frequency of the respective phase-shifted freewheeling drive signal that is identical to a frequency of the original freewheeling drive signal.

A further aspect of the present disclosure features a gradient system of a nuclear magnetic resonance imaging (MRI) system. The gradient system includes a gradient amplifier and a gradient coil. The gradient amplifier includes: N working half-bridge groups, N being an integer greater than 1, where each of the working half-bridge groups includes: a first working half-bridge having a first switch and a second switch, an emitter of the first switch being coupled with a collector of the second switch at a first coupling point; and a second working half-bridge having a third switch and a fourth switch, an emitter of the third switch being coupled with a collector of the fourth switch at a second coupling point. The gradient coil coupled between the first coupling point and the second coupling point. The gradient amplifier is configured such that a current flowing through the gradient coil is a sum of currents flowing through the N working half-bridge groups.

Each of the working half-bridge groups is configured such that a first current path from a power supply through the first switch, the gradient coil and the fourth switch in succession back to the power supply and a second current path from the power supply through the third switch, the gradient coil and the second switch in succession back to the power supply are formed, and a current output from the power supply flows in one of the first current path and the second current path through the gradient coil.

In some implementations, the gradient system further includes a driving circuit for the N working half-bridge groups, the driving circuit including: N−1 first phase shifters each configured to perform phase shifting of 360*(i−1)/N degree for an original drive signal to obtain a respective phase-shifted drive signal, i being an integer greater than 1 but no more than N, where the original drive signal is a phase-shifted drive signal with 0 degree phase shift; and N first frequency dividers each configured to divide a frequency of a respective one of the phase-shifted drive signals by N to obtain a respective drive signal for driving at least one switch in a corresponding one of the N working half-bridge groups.

In some implementations, in each of the working half-bridge groups, respective gates of the first switch and the fourth switch are coupled with a first drive input end to receive a first drive signal, respective gates of the second switch and the third switch are coupled with a second drive input end to receive a second drive signal, and the first drive signal and the second drive signal are configured to alternately turn on the first switch and the fourth switch, and the second switch and the third switch, and respective drive signals of the N working half-bridge groups are shifted in phase by 360/N degrees in sequence.

The gradient system can further include N freewheeling half-bridge groups. Each of the freewheeling half-bridge groups can include: a first freewheeling half bridge having a fifth switch and a sixth switch, an emitter of the fifth switch being coupled with an emitter of the sixth switch; and a second freewheeling half-bridge having a seventh switch and an eighth switch, an emitter of the seventh switch being coupled with an emitter of the eighth switch, where a collector of the fifth switch is coupled with the second coupling point, a collector of the sixth switch is coupled with a collector of the seventh switch, and a collector of the eighth switch is coupled with the first coupling point.

The gradient system can further include a drive circuit for the N freewheeling half-bridge groups, the drive circuit including: N−1 second phase shifters each configured to perform phase shifting of 360*(i−1)/N degree for an original freewheeling drive signal to obtain a respective phase-shifted freewheeling drive signal, where the original freewheeling drive signal is a phase-shifted freewheeling drive signal with 0 degree phase shift; and N second frequency dividers each configured to drive a frequency of a respective one of the phase-shifted freewheeling drive signals by N to obtain a respective freewheeling drive signal for driving at least one switch in a corresponding one of the N freewheeling half-bridge groups.

In some implementations, in each of the freewheeling half-bridge groups, respective gates of the fifth switch and the seventh switch are coupled with a first freewheeling drive input end to receive a first freewheeling drive signal, respective gates of the sixth switch and the eighth switch are coupled with a second freewheeling drive input end to receive a second freewheeling drive signal, and the first freewheeling drive signal and the second freewheeling drive signal are configured to alternatively turn on the fifth switch and the seventh switch, and the eighth switch and the sixth switch, and respective freewheeling drive signals of the N freewheeling half-bridge groups are shifted in phase by 360/N degrees in sequence.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

The technical solutions of examples of the present disclosure will be described clearly and fully below in combination with drawings in the examples of the present disclosure. It is apparent that the described examples are merely part of examples of the present disclosure rather than all examples. Other examples achieved by those of ordinary skill in the art based on the examples in the present disclosure without paying creative work shall all fall into the scope of protection of the present disclosure.

According to an example of the present disclosure, there is provided a gradient amplifier, which may be applied to a gradient system of an MRI system. In an example, the gradient amplifier may include: a plurality of working half-bridge groups, such as two, three, four or more. Each of the working half-bridge groups may include two working half-bridges. Each working half-bridge may include two switches, such as, two IGBTs (Insulated Gate Bipolar Transistors), two MOS (Metal Oxide Semiconductors), and so on.

In the following, by taking each of the switches in each of the working half-bridges is IGBT as an example, the gradient amplifier provided by the present application is described.

In some cases, each of the working half-bridge groups includes two working half-bridges, such as a first working half-bridge and a second working half-bridge. The first working half-bridge includes two IGBTs, such as a first IGBT and a second IGBT. An emitter of the first IGBT may be coupled with a collector of the second IGBT. The second working half-bridge includes two IGBTs, such as a third IGBT and a fourth IGBT. A gradient coil may be provided between a first coupling point in the first working half-bridge and a second coupling point in the second working half-bridge. The first coupling point may be located between the first IGBT and the second IGBT. The second coupling point may be located between the third IGBT and the fourth IGBT. In this way, a current output from a power supply may flow through the first IGBT in the first working half-bridge and the gradient coil before flowing through the fourth IGBT in the second working half-bridge. Alternatively, the current output from the power supply may flow through the third IGBT in the second working half-bridge and the gradient coil before flowing through the second IGBT in the first working half-bridge. A gradient magnetic field may be generated when the current flows through the gradient coil. The gradient coil can be a load of the gradient amplifier.

It is noted that each of the IGBTs described in the present disclosure may be a voltage-driven power semiconductor device, e.g., a Bipolar Junction Transistor (BJT) or an MOS, which has a high input impedance, a low turn-on voltage drop, a low drive power and a low saturation voltage drop. The MOS may include a body diode.

Figure 1:
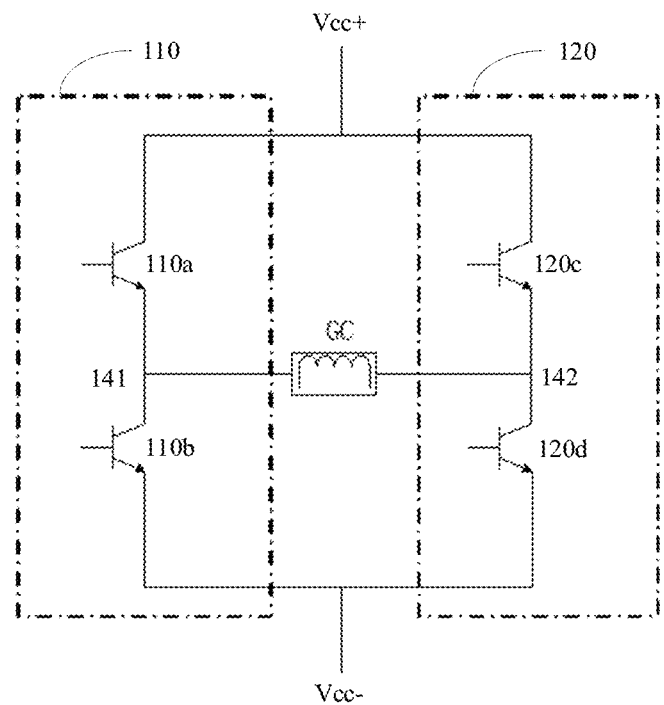
FIG. 1 is a schematic diagram illustrating a coupling structure of one working half-bridge group in a gradient amplifier, according to an example of the present disclosure.

FIG. 1 is a schematic diagram illustrating a coupling structure of one working half-bridge group in a gradient amplifier according to an example of the present disclosure. The working half-bridge group includes a first working half-bridge 110 and a second working half-bridge 120. The first working half-bridge 110 includes a first IGBT 110a and a second IGBT 110b. An emitter of the first IGBT 110a is coupled with a collector of the second IGBT 110*b*. The second working half-bridge 120 includes a third IGBT 120*c* and a fourth IGBT 120*d*. An emitter of the third IGBT 120*c* is coupled with a collector of the fourth IGBT 120*d*. A coupling point 141 between the first IGBT 110*a* and the second IGBT 110*b* is coupled with one end of a gradient coil (GC). The other end of the GC is coupled with a coupling point 142 between the third IGBT 120*c* and the fourth IGBT 120*d*. A positive Vcc+ of a power supply is coupled with the collector of the first IGBT 110*a* and the collector of the third IGBT 120*c*. A negative Vcc− of the power supply is coupled with the emitter of the second IGBT 110*b* and the emitter of the fourth IGBT 120*d*. In this way, a current output from the positive Vcc+ of the power supply may flow through the first IGBT 110*a*, the GC and the fourth IGBT 120*d* before flowing back to the negative Vcc− of the power supply. Alternatively, the current output from the positive Vcc+ of the power supply may flow through the third IGBT 120*c*, the GC and the second IGBT 110*b* before flowing back to the negative Vcc− of the power supply.

Based on the structure shown in FIG. 1, freewheeling half-bridge(s) may be provided in the gradient amplifier to reduce a current ripple. In an example, a plurality of freewheeling half-bridge groups may be provided in the gradient amplifier, and a number of the freewheeling half-bridge groups may be the same as that of the working half-bridge groups. In this way, one freewheeling half-bridge group may cooperate with one working half-bridge group. Each of the freewheeling half-bridge groups may include two freewheeling half-bridges, each of which may include two IGBTs. Further, in each of the freewheeling half-bridges, an emitter of one IGBT may be coupled with that of the other IGBT.

In some examples, a working half-bridge group includes a first working half-bridge and a second working half-bridge, and a freewheeling half-bridge group includes a first freewheeling half-bridge and a second freewheeling half-bridge. The freewheeling half-bridge group is cooperated with the working half-bridge group. A coupling point between two IGBTs in the first working half-bridge may be coupled with a collector of one of the two IGBTs in the first freewheeling half-bridge, a collector of the other of the two IGBTs in the first freewheeling half-bridge may be coupled with a collector of one of the two IGBTs in the second freewheeling half-bridge, and a collector of the other of the two IGBTs in the second freewheeling half-bridge may be coupled with the coupling point between the two IGBTs in the second working half-bridge.

Figure 2:
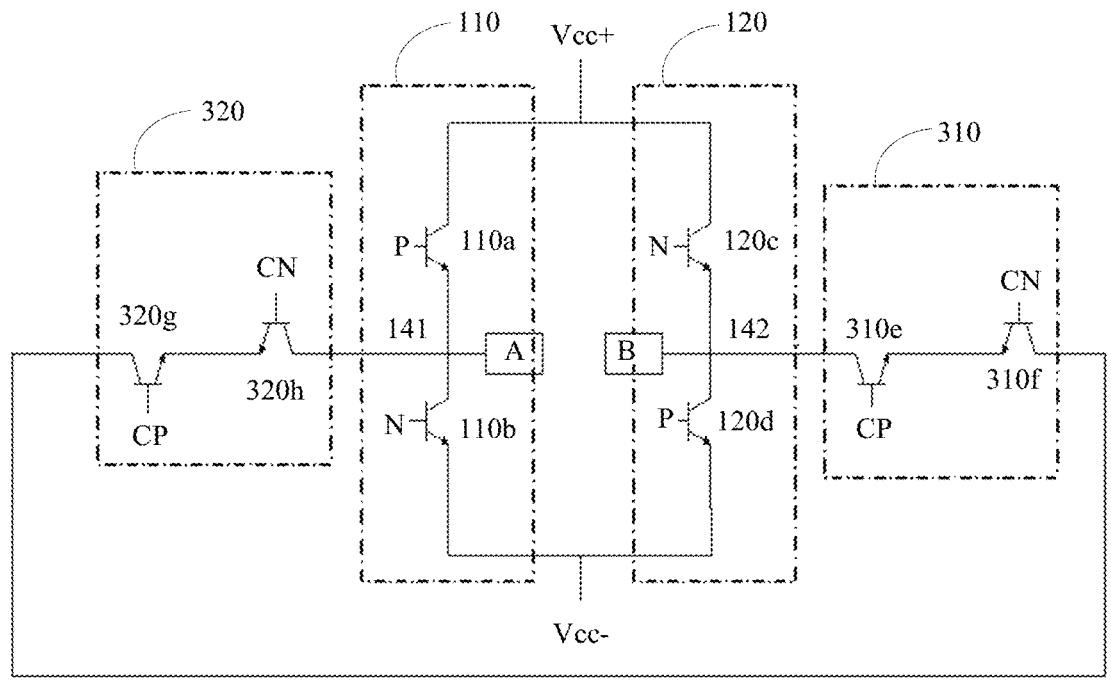
FIG. 2 is a schematic diagram illustrating a structure of a gradient amplifier including a working half-bridge group and a freewheeling half-bridge group, according to an example of the present disclosure.

FIG. 2 is a schematic diagram illustrating a structure of a gradient amplifier including a working half-bridge group and a freewheeling half-bridge group according to an example of the present disclosure.

Combined with FIG. 1, as shown in FIG. 2, the freewheeling half-bridge group includes a first freewheeling half-bridge 310 and a second freewheeling half-bridge 320. The first freewheeling half-bridge 310 includes a fifth IGBT 310*e* and a sixth IGBT 310*f*, and the second freewheeling half-bridge 320 includes a seventh IGBT 320*g* and an eighth IGBT 320*h*. In the first freewheeling half-bridge 310, an emitter of the fifth IGBT 310*e* is coupled with that of the sixth IGBT 310*f*. In the second freewheeling half-bridge 320, an emitter of the seventh IGBT 320*g* is coupled with that of the eighth IGBT 320*h*. The coupling point 141 between the two IGBTs 110*a*, 110*b* in the first working half-bridge 110 is coupled with the collector of the eighth IGBT 320*h* in the second freewheeling half-bridge 320. The collector of the seventh IGBT 320*g* in the second freewheeling half-bridge 320 is coupled with that of the sixth IGBT 310*f* in the first freewheeling half-bridge 310. The collector of the fifth IGBT 310*e* in the first freewheeling half-bridge 310 is coupled with the coupling point 142 between the two IGBTs 120*c*, 120*d* in the second working half-bridge 120.

In an example, the working half-bridges and the freewheeling half-bridges in the gradient amplifier are driven by at least one driving circuit. The gradient amplifier may further include: a working half-bridge driving circuit coupled with a gate of each of the IGBTs in each of the working half-bridges in the working half-bridge group and configured to provide a respective drive signal for each of the working half-bridges, e.g., in a manner of phase shift and frequency division.

Moreover, the gradient amplifier may further include: a freewheeling half-bridge driving circuit coupled with a gate of each of the IGBTs in each of the freewheeling half-bridges in the freewheeling half-bridge group and configured to provide a respective drive signal for each of the freewheeling half-bridges, e.g., in a manner of phase shift and frequency division.

A coupling structure of drive input ends of the freewheeling half-bridge group and the working half-bridge group may be as shown in FIG. 2. The working half-bridge group including the first working half-bridge 110 and the second working half-bridge 120 may include two drive input ends, such as a first drive input end P and a second drive input end N. The first drive input end P is coupled with the gates of the first IGBT 110*a* and the fourth IGBT 120*d*. The second drive input end N is coupled with the gates of the third IGBT 120*c* and the second IGBT 110*b*. The freewheeling half-bridge group including the first freewheeling half-bridge 310 and the second freewheeling half-bridge 320 may include two drive input ends, such as a first drive input end CP and a second drive input end CN. The first drive input end CP is coupled with the gates of the fifth IGBT 310*e* and the seventh IGBT 320*g*. The second drive input end CN is coupled with the gates of the sixth IGBT 310*f* and the eighth IGBT 320*h*.

Figure 3:
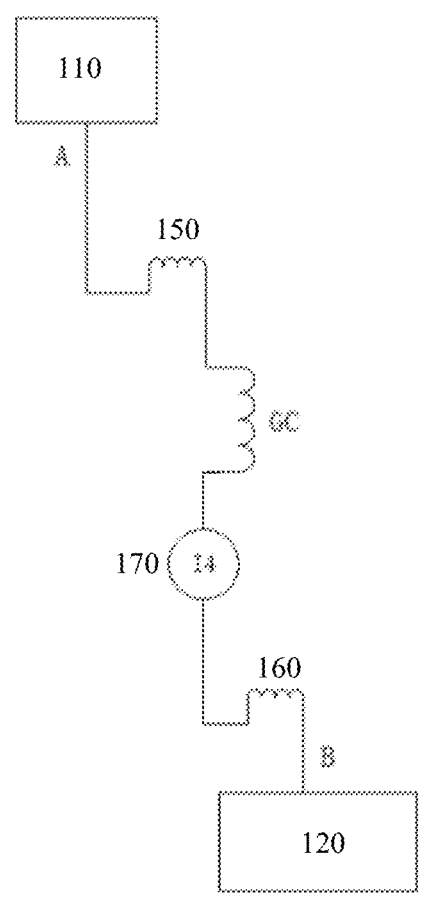
FIG. 3 is a schematic diagram illustrating a structure in which an inductor is coupled between a working half-bridge and a gradient coil in the gradient amplifier shown in FIG. 2.

Based on the structure shown in FIG. 2, at least one inductor may be coupled between the coupling point of the two IGBTs in each of working half-bridges and the GC. FIG. 3 is a schematic diagram illustrating a structure in which at least one inductor is coupled between a working half-bridge and the GC in the gradient amplifier shown in FIG. 2. For example, an inductor 150 is coupled between the first working half-bridge 110 and the GC, and an inductor 160 is coupled between the second working half-bridge 120 and the GC. The first working half-bridge 110 is coupled with the inductor 150 by the coupling end A. The second working half-bridge 120 is coupled with the inductor 160 by the coupling end B. The GC is coupled between the two inductors 150, 160, and an ammeter 170 is coupled between the two inductors 150, 160 to monitor a current I4 flowing through the GC.

Figure 4A:
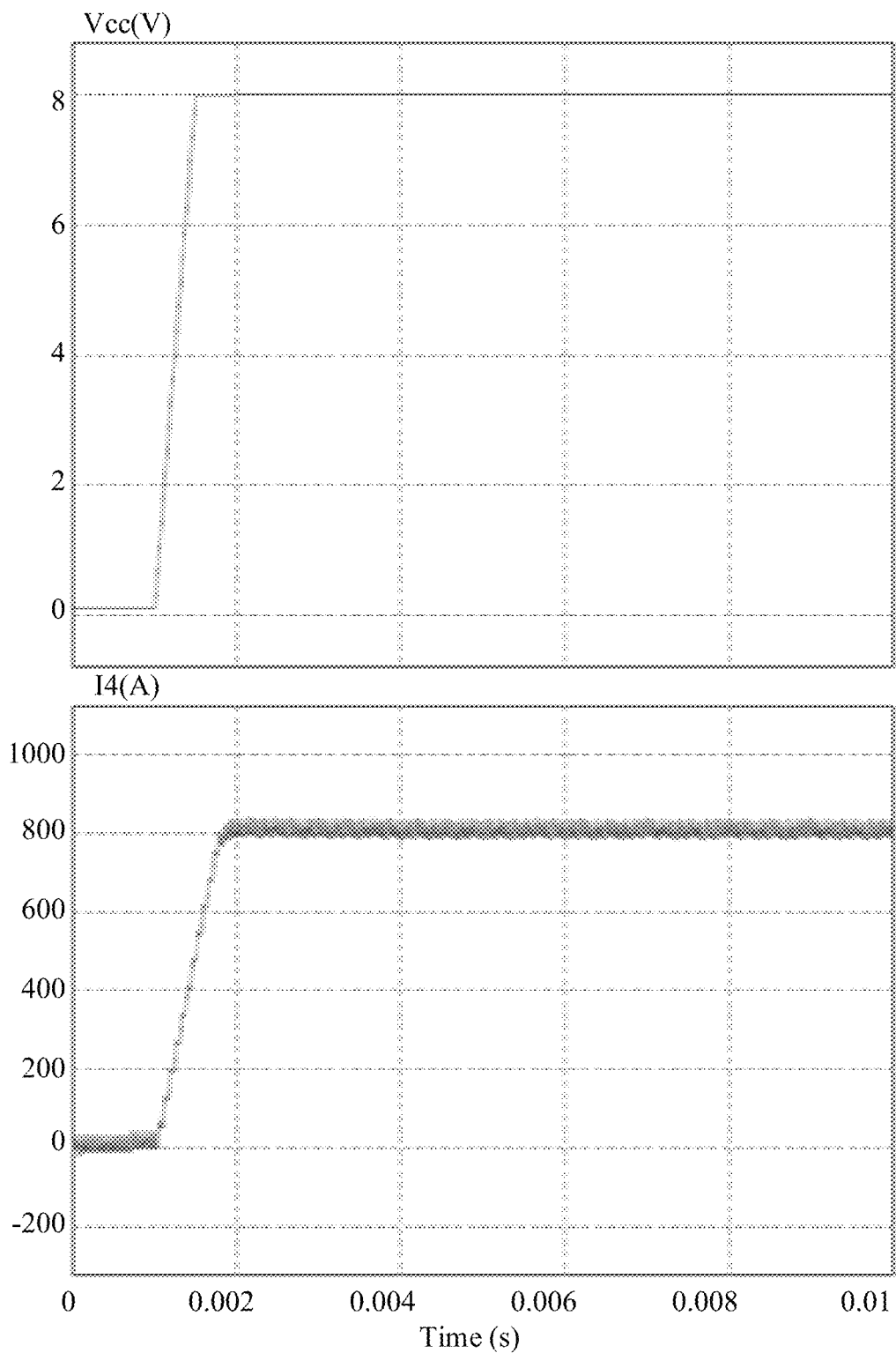
FIG. 4A is a schematic diagram illustrating an input voltage and a current flowing through a gradient coil of the gradient amplifier shown in FIG. 2 and FIG. 3 in a case of a gain of 1V/100 A.

FIG. 4A is a schematic diagram illustrating an input voltage and a current of the gradient amplifier shown in FIG. 2 and FIG. 3 in the case of a gain of 1V/100 A. It can be seen from FIG. 4A that the ripple of the current I4 output from the gradient amplifier is relatively large.

Figure 4B:
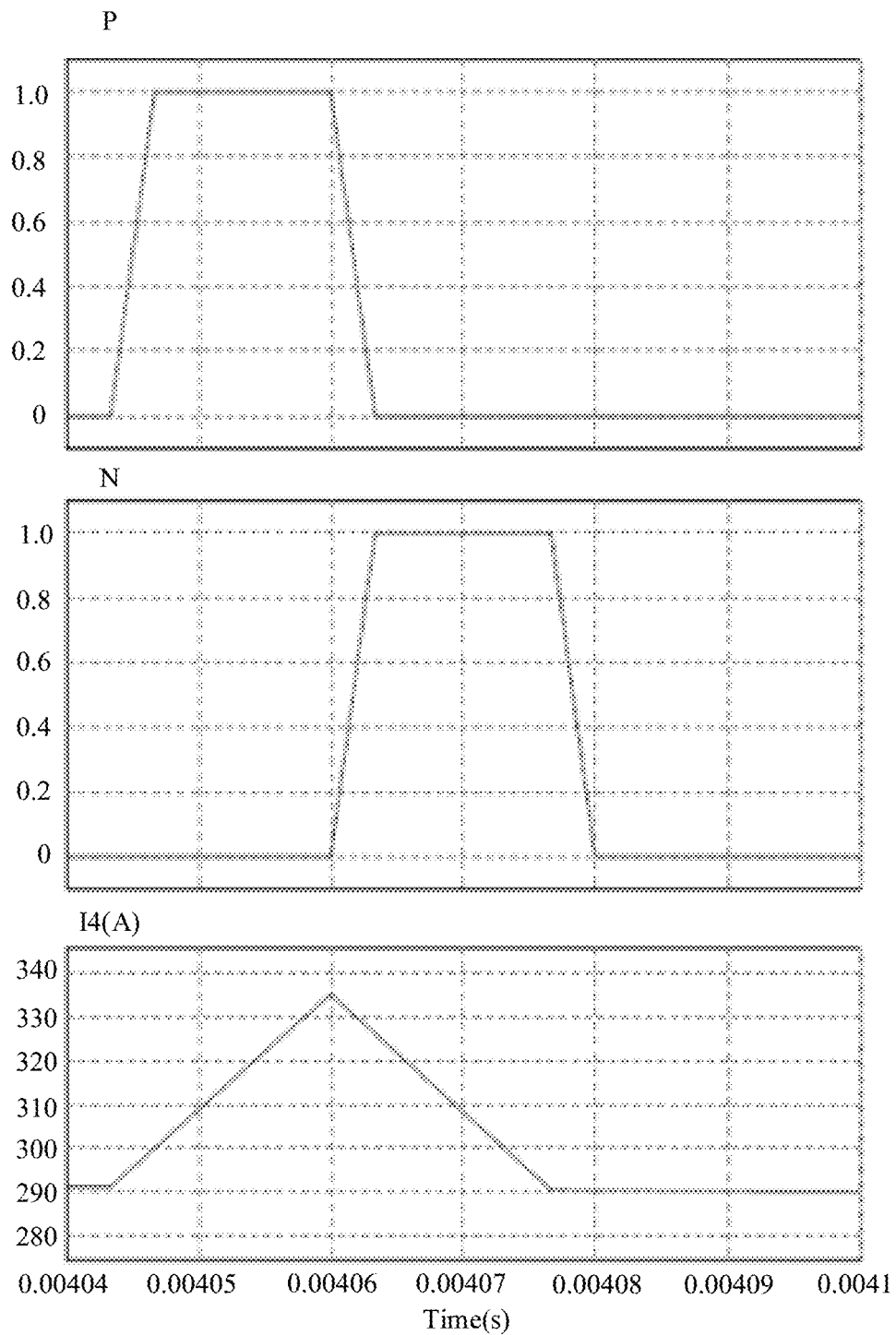
FIG. 4B is a schematic diagram illustrating a time sequence of a drive signal input to a drive input end of the gradient amplifier shown in FIG. 2 and FIG. 3 and a corresponding current flowing through the gradient coil of the gradient amplifier shown in FIG. 2 and FIG. 3.

FIG. 4B is a schematic diagram illustrating a time sequence of a drive signal input to a drive input end of the gradient amplifier shown in FIG. 2 and FIG. 3 and a corresponding current flowing through the gradient coil of the gradient amplifier shown in FIG. 2 and FIG. 3.

As shown in the top part of FIG. 4B, when a drive signal input to the drive input end P is 1, the first IGBT 110*a* in the first working half-bridge 110 and the fourth IGBT 120*d* in the second working half-bridge 120 can be turned on. When the drive signal input to the drive input end P is 0, the first IGBT 110*a* and the fourth IGBT 120*d* can be turned off.

As shown in the middle part of FIG. 4B, when a drive signal input to the drive input end N is 1, the third IGBT 120*c* in the second working half-bridge 120 and the second IGBT 110*b* in the first working half-bridge 110 can be turned on. When the drive signal input to the drive input end N is 0, the third IGBT 120*c* and the second IGBT 110*b* can be turned off.

Moreover, it can be seen from the bottom part of FIG. 4B that the current I4 of the gradient amplifier may undergo three stages when it is substantially in a relatively stable state.

A first stage may be a current rise stage. At the first stage, the current I4 may sequentially flow through the positive Vcc+ of the power supply, the first IGBT 110*a* in the first working half-bridge 110, the GC, the fourth IGBT 120*d* in the second working half-bridge 120 and the negative Vcc− of the power supply.

A second stage may be a current drop stage. At the second stage, the current I4 may sequentially flow through the positive Vcc+ of the power supply, the third IGBT 120*c* in the second working half-bridge 120, the GC, the second IGBT 110*b* in the first working half-bridge 110 and the negative Vcc− of the power supply. As the current I4 flowing through the GC in the second stage is opposite in direction to the current I4 flowing through the GC in the first stage, the current I4 flowing through the GC in the second stage may drop.

A third stage may be a freewheeling stage. At the third stage, the current I4 may sequentially flow through the GC, the fifth IGBT 310*e* in the first freewheeling half-bridge 310, a body diode in the sixth IGBT 310*f* in the first freewheeling half-bridge 310, the seventh IGBT 320*g* in the second freewheeling half-bridge 320, a body diode in the eighth IGBT 320*h* in the second freewheeling half-bridge 320 and the GC.

When a time sequence of the drive signal input to the drive input end is opposite to that shown in FIG. 4B, for example, if the drive signal input to the drive input end N is 1 first, and then the drive signal input to the drive input end P is 1, the current I4 is in an opposite direction as well. That is, the current I4 flows from the coupling end B to the coupling end A. Moreover, the current I4 may also undergo three stages when it is substantially in a relatively stable state.

A first stage is a current rise stage. At the first stage, the current I4 may sequentially flow through the positive Vcc+ of the power supply, the third IGBT 120*c* in the second working half-bridge 120, the GC, the second IGBT 110*b* in the first working half-bridge 110 and the negative Vcc− of the power supply.

A second stage is a current drop stage. At the second stage, the current I4 may sequentially flow through the positive Vcc+ of the power supply, the first IGBT 110*a* in the first working half-bridge 110, the GC, the fourth IGBT 120*d* in the second working half-bridge 120 and the negative Vcc− of the power supply. As the current I4 flowing through the GC in the second stage is opposite in direction to the current I4 flowing through the GC in the first stage, the current I4 flowing through the GC in the second stage may drop.

A third stage is a freewheeling stage. At the third stage, the current I4 may sequentially flow through the GC, the eighth IGBT 320*h* in the second freewheeling half-bridge 320, a body diode in the seventh IGBT 320*g* in the second freewheeling half-bridge 320, the sixth IGBT 310*f* in the first freewheeling half-bridge 310, a body diode in the fifth IGBT 310*e* in the first freewheeling half-bridge 310 and the GC.

In FIG. 2 and FIG. 3, 2\*1 working half-bridges and 2\*1 corresponding freewheeling half-bridges are provided. If 2\*N working half-bridges and 2\*N corresponding freewheeling half-bridges are provided in the gradient amplifier (N>1), power density, voltage stress and current stress of each of the IGBTs in the half-bridges can be significantly reduced, thereby further reducing the ripple of the current I4 flowing through the GC.

Figure 5:
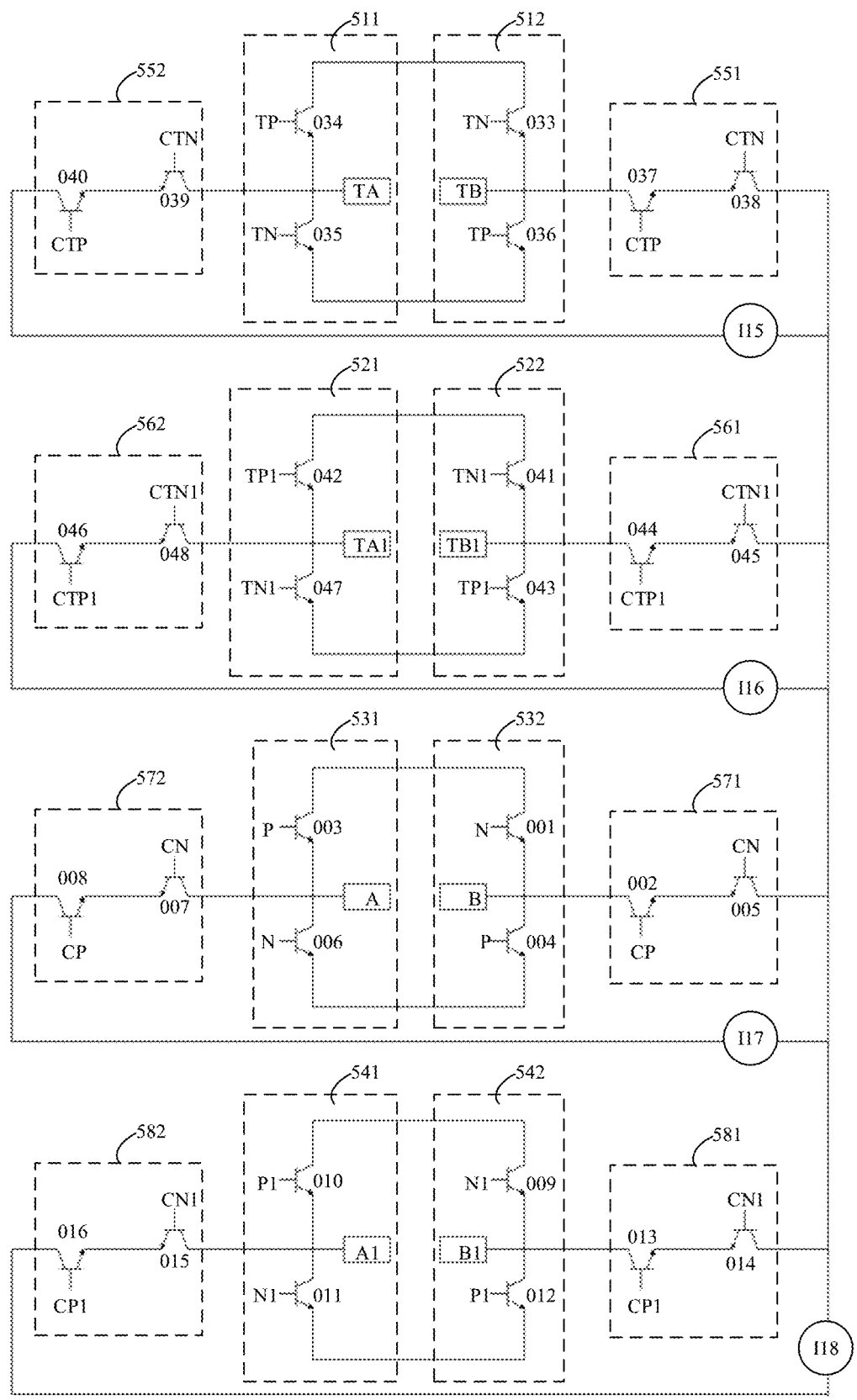
FIG. 5 is a schematic diagram illustrating a structure of a gradient amplifier including four working half-bridge groups and four freewheeling half-bridge groups according to an example of the present disclosure.
Figure 6:
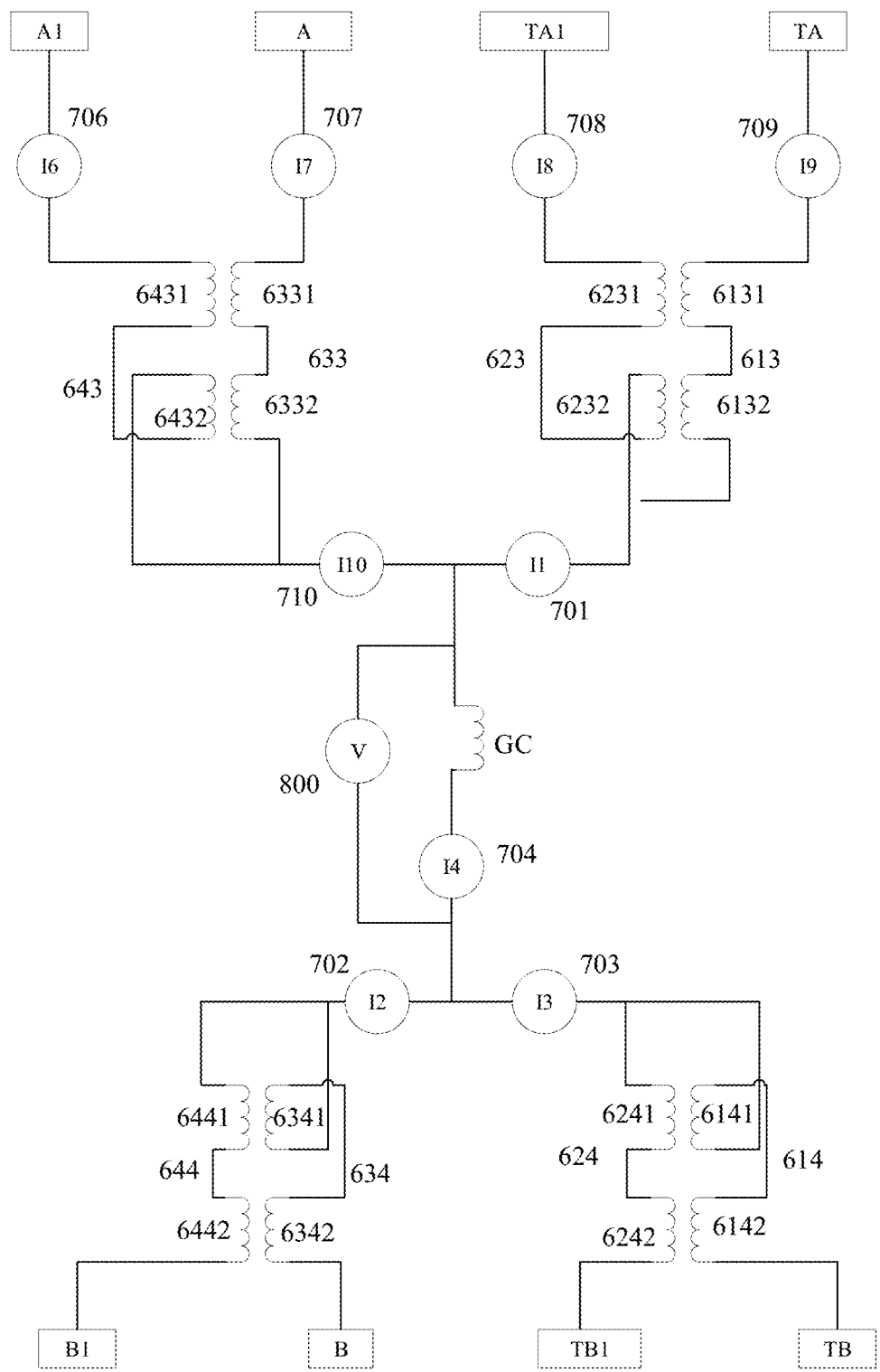
FIG. 6 is a schematic diagram illustrating a structure in which an inductor is coupled between a working half-bridge and a gradient coil in the gradient amplifier shown in FIG. 5.

FIG. 5 is a schematic diagram illustrating a structure of a gradient amplifier including four working half-bridge groups and four freewheeling half-bridge groups according to an example of the present disclosure. FIG. 6 is a schematic diagram illustrating a structure in which a respective inductor is coupled between each of the working half-bridges and a gradient coil in the gradient amplifier shown in FIG. 5. As shown in FIG. 5 and FIG. 6, the gradient amplifier may include four working half-bridge groups 511-512, 521-522, 531-532 and 541-542, eight inductors 613, 614, 623, 624, 633, 634, 643 and 644, four freewheeling half-bridge groups 551-552, 561-562, 571-572 and 581-582, and sixteen drive input ends TP, TN, TP1, TN1, P, N, P1, N1, CTP, CTN, CTP1, CTN1, CP, CN, CP1 and CN1.

As shown in FIG. 5, the working half-bridge 511 includes IGBT 034 and IGBT 035. The working half-bridge 512 includes IGBT 033 and IGBT 036. One of the four working half-bridge groups includes the working half-bridge 511 and the working half-bridge 512. The drive input end TP is configured for IGBT 034 and IGBT 036 to receive a corresponding drive signal. The drive input end TN is configured for IGBT 033 and IGBT 035 to receive a corresponding drive signal. Furthermore, the working half-bridge 511 is coupled with the inductor 613 by the coupling end TA. The inductor 613 includes two parts, such as an upper part 6131 and a lower part 6132. The working half-bridge 512 is coupled with the inductor 614 by the coupling end TB. The inductor 614 includes two parts, such as an upper part 6141 and a lower part 6142. A GC is coupled between the two inductors 613, 614.

As shown in FIG. 5, the working half-bridge 521 includes IGBT 042 and IGBT 047. The working half-bridge 522 includes IGBT 041 and IGBT 043. One of the four working half-bridge groups includes the working half-bridge 521 and the working half-bridge 522. The drive input end TP1 is configured for IGBT 042 and IGBT 043 to receive a corresponding drive signal. The drive input end TN1 is configured for IGBT 041 and IGBT 047 to receive a corresponding drive signal. Furthermore, the working half-bridge 521 is coupled with the inductor 623 by the coupling end TA1. The inductor 623 includes two parts, such as an upper part 6231 and a lower part 6232. The working half-bridge 522 is coupled with the inductor 624 by the coupling end TB1. The inductor 624 includes two parts, such as an upper part 6241 and a lower part 6242. The GC is coupled between the inductors 623, 624.

As shown in FIG. 5, the working half-bridge 531 includes IGBT 003 and IGBT 006. The working half-bridge 532 includes IGBT 001 and IGBT 004. One of the four working half-bridge groups includes the working half-bridge 531 and the working half-bridge 532. The drive input end P is configured for IGBT 003 and IGBT 004 to receive a corresponding drive signal. The drive input end N is configured for IGBT 001 and IGBT 006 to receive a corresponding drive signal. Furthermore, the working half-bridge 531 is coupled with the inductor 633 by the coupling end A. The inductor 633 includes two parts, such as an upper part 6331 and a lower part 6332. The working half-bridge 532 is coupled with the inductor 634 by the coupling end B. The inductor 634 includes two parts, such as an upper part 6341 and a lower part 6342. The GC is coupled between the inductors 633, 634.

As shown in FIG. 5, the working half-bridge 541 includes IGBT 010 and IGBT 011. The working half-bridge 542 includes IGBT 009 and IGBT 012. One of the four working half-bridge groups includes the working half-bridge 541 and the working half-bridge 542. The drive input end P1 is configured for IGBT 010 and IGBT 012 to receive a corresponding drive signal. The drive input end N1 is configured for IGBT 009 and IGBT 011 to receive a corresponding drive signal. Furthermore, the working half-bridge 541 is coupled with the inductor 643 by the coupling end A1. The inductor 643 includes two parts, such as an upper part 6431 and a lower part 6432. The working half-bridge 542 is coupled with the inductor 644 by the coupling end B1. The inductor 644 includes two parts, such as an upper part 6441 and a lower part 6442. The GC is coupled between the inductors 643, 644.

As shown in FIG. 5, the freewheeling half-bridge 551 includes IGBT 037 and IGBT 038. The freewheeling half-bridge 552 includes IGBT 039 and IGBT 040. One of the four freewheeling half-bridge groups includes the freewheeling half-bridge 551 and the freewheeling half-bridge 552. The drive input end CTP is configured for IGBT 037 and IGBT 040 to receive a corresponding drive signal. The drive input end CTN is configured for IGBT 038 and IGBT 039 to receive a corresponding drive signal.

As shown in FIG. 5, the freewheeling half-bridge 561 includes IGBT 044 and IGBT 045. The freewheeling half-bridge 562 includes IGBT 046 and IGBT 048. One of the four freewheeling half-bridge groups includes the freewheeling half-bridge 561 and the freewheeling half-bridge 562. The drive input end CTP1 is configured for IGBT 044 and IGBT 046 to receive a corresponding drive signal. The drive input end CTN1 is configured for IGBT 045 and IGBT 048 to receive a corresponding drive signal.

As shown in FIG. 5, the freewheeling half-bridge 571 includes IGBT 002 and IGBT 005. The freewheeling half-bridge 572 includes IGBT 008 and IGBT 007. One of the four freewheeling half-bridge groups includes the freewheeling half-bridge 571 and the freewheeling half-bridge 572. The drive input end CP is configured for IGBT 002 and IGBT 008 to receive a corresponding drive signal. The drive input end CN is configured for IGBT 005 and IGBT 007 to receive a corresponding drive signal.

As shown in FIG. 5, the freewheeling half-bridge 581 includes IGBT 013 and IGBT 014. The freewheeling half-bridge 582 includes IGBT 016 and IGBT 015. One of the four freewheeling half-bridge groups includes the freewheeling half-bridge 581 and the freewheeling half-bridge 582. The drive input end CP1 is configured for IGBT 013 and IGBT 016 to receive a corresponding drive signal. The drive input end CN1 is configured for IGBT 014 and IGBT 015 to receive a corresponding drive signal.

As shown in FIG. 6, the inductors 643, 633, 623, 613, 644, 634, 624 and 614 are respectively coupled between the coupling ends A1, A, TA1, TA, B1, B, TB1 and TB and the GC. The upper parts 6131, 6231 may form a common-mode inductor set to filter out common-mode noise. The lower part 6132, 6232 may form a differential-mode inductor set to filter out differential-mode noise. Similarly, the upper parts 6331, 6431 may form a common-mode inductor set to filter out common-mode noise, the lower part 6332, 6432 may form a differential-mode inductor set to filter out differential-mode noise, the upper parts 6141, 6241 may form a differential-mode inductor set to filter out differential-mode noise, the lower parts 6142, 6242 may form a common-mode inductor set to filter out common-mode noise, the upper parts 6341, 6441 may form a differential-mode inductor set to filter out differential-mode noise, the lower parts 6342, 6442 may form a common-mode inductor set to filter out common-mode noise. In this way, the ripple of the current I4 can be further reduced. Moreover, ammeters 701, 702, 703, 710, 706, 707, 708 and 709 may be provided on a plurality of intermediate lines for coupling the inductors 623/613, 644/634, 624/614 and 633/643 with the GC and for coupling the inductors 643, 633, 623 and 613 with the coupling ends A1, A, TA1 and TA, so as to monitor currents I1, I2, I3, I10, I6, I7, I8 and I9, respectively. Moreover, an ammeter 704 may further be provided to monitor the current I4 flowing through the GC, and a voltmeter 800 may further be provided to monitor a voltage V applied to the GC. There are four parallel current paths including from TA to TB, TA1 to TB1, A to B, and A1 to B1 that pass through the GC. As described with further details in FIGS. 8A and 8B, the current I4 is a sum of the currents I6, I7, I8 and I9 in the four current paths, which enables to reduce the ripple of the current I4.

In some cases, the gradient amplifier provided by the present disclosure includes 2*N working half-bridges and 2*N freewheeling half-bridges, where N is an integer greater than 1. Compared to the gradient amplifier in FIG. 3 including 2*1 working half-bridges and 2*1 freewheeling bridges, the gradient amplifier in FIG. 5 includes 2*4 working half-bridges and 2*4 freewheeling half-bridges, where voltage stress and current stress of each of the IGBTs in the whole gradient amplifier can be lowered, thereby reducing the ripple of the current I4 flowing through the GC and lowering loss of the GC.

Figure 7:
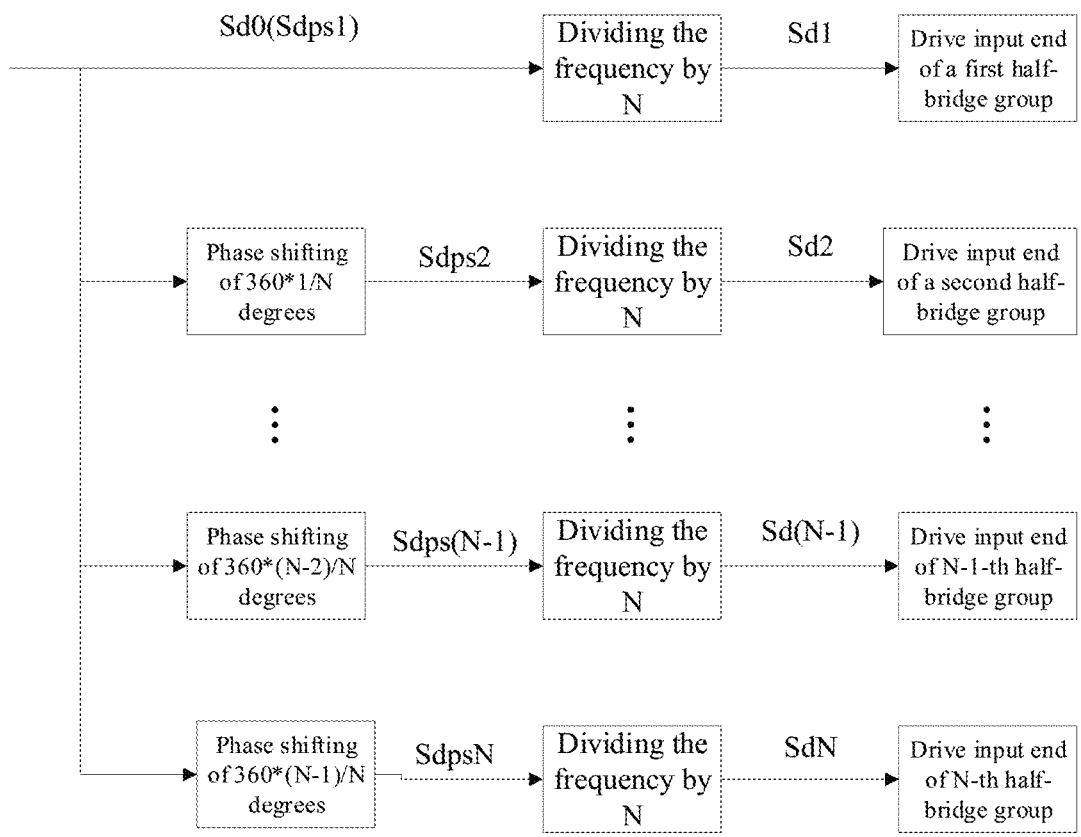
FIG. 7 is a schematic diagram illustrating a structure of a drive circuit including N working half-bridge groups and N freewheeling half-bridge groups, according to an example of the present disclosure.

FIG. 7 is a schematic diagram illustrating a structure of a drive circuit including N working half-bridge groups and N freewheeling half-bridge groups according to an example of the present disclosure. As shown in FIG. 7, after being shifted in phase by a corresponding integer multiple of 360*1/N degrees and divided in frequency by N, the respective drive signals may be input to the corresponding drive input ends of the 2*N working half-bridges and the 2*N freewheeling half-bridges in the gradient amplifier, for example, to the corresponding gate of each of the IGBTs in each of the half-bridges, thus further reducing the ripple of the current I4 flowing through the GC.

It is assumed that a drive signal Sd0 to be input to the gradient amplifier including 2*4 working/freewheeling half-bridges shown in FIG. 5 is the same as that input to the gradient amplifier including 2*1 working/freewheeling half-bridges shown in FIG. 3. For example, a time sequence of a drive signal Sd1 input to the drive input ends P, N of the working half-bridges 531, 532 and the drive input ends CP, CN of the freewheeling half-bridges 571, 572 in FIG. 5 may be the same as that of a drive signal of 2*1 working/ freewheeling half-bridges shown in FIG. 3. The time sequence of the drive signal may be the time sequence shown in FIG. 4B. Moreover, referring to FIG. 7, a drive signal Sdi of the other three working half-bridge groups and corresponding freewheeling half-bridge groups may be shifted in phase by 360*(i−1)/N degrees based on the drive signal Sd1, where i is an integer greater than 1 and may represent a sequence number of a working/freewheeling half-bridge group.

Figure 7A:
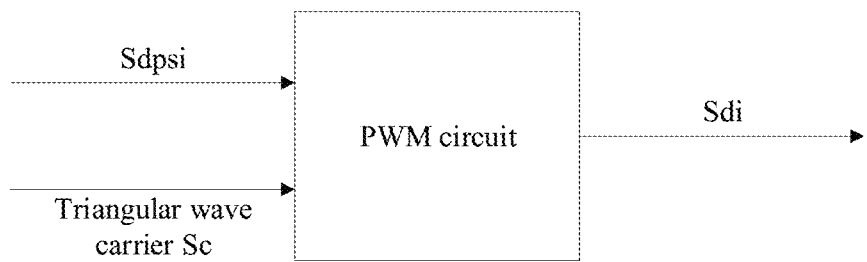
FIG. 7A is a schematic diagram illustrating a structure of a circuit for dividing a frequency by N shown in FIG. 7.

As shown in FIG. 7, after phase shifting of 360*(i−1)/N degrees is performed for a drive signal Sd0 to obtain a phase-shifted drive signal Sdpsi corresponding to the i-th half-bridge group, the phase-shifted drive signal Sdpsi may be further divided in frequency by N to obtain the drive signal Sdi to be input to the i-th half-bridge group. It is noted that the sequence of phase shifting and frequency division may be changed. In other words, frequency division may be first performed and then the phase shifting may be performed. FIG. 7A is a schematic diagram illustrating a structure of a circuit for dividing a frequency by N shown in FIG. 7. As shown in FIG. 7A, the phase-shifted drive signal Sdpsi may be input to a Pulse Width Modulation (PWM) circuit together with a triangular wave carrier Sc. The PWM circuit may be configured to perform triangular wave modulation on the phase-shifted drive signal Sdpsi, thereby obtaining the drive signal Sdi to be input to a drive input end of the i-th half-bridge group.

Figure 8A:
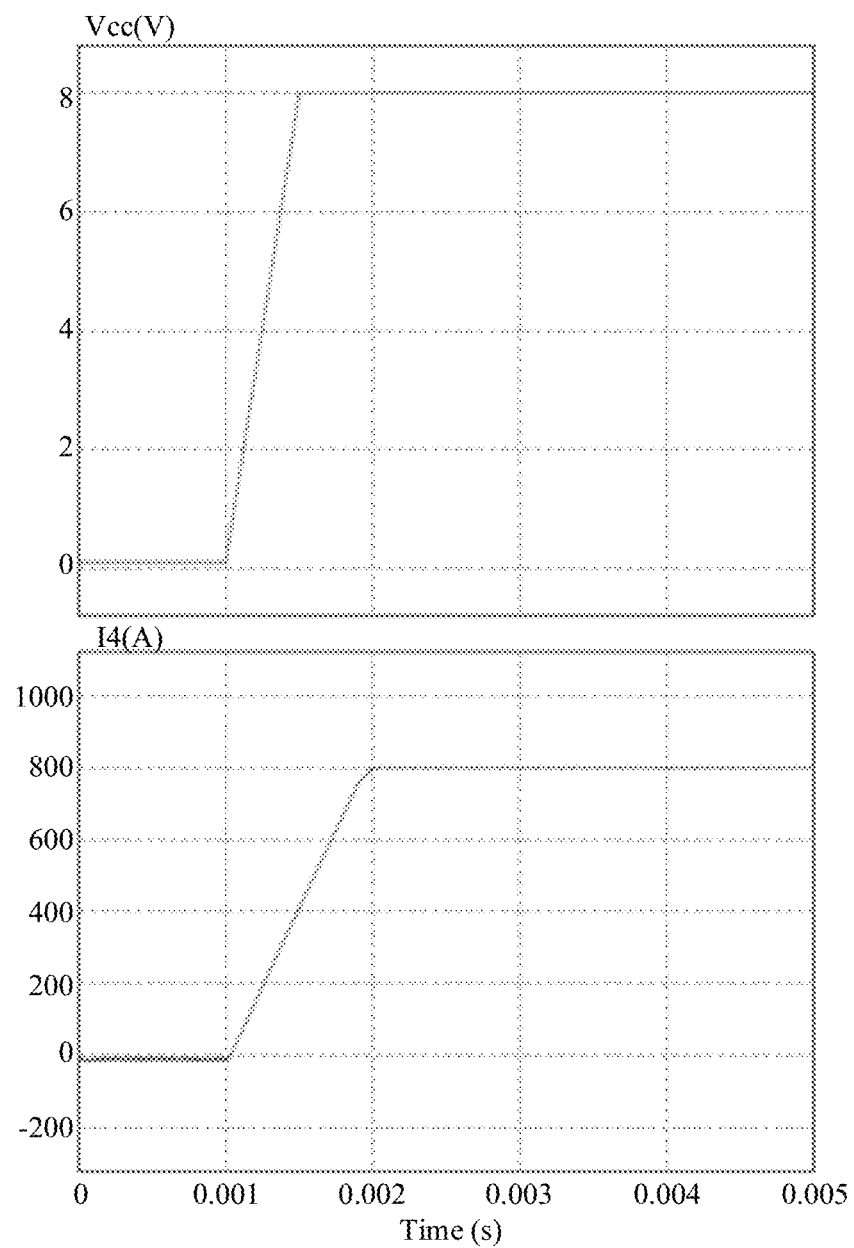
FIG. 8A is a schematic diagram illustrating an input voltage and a current flowing through a gradient coil in the gradient amplifier shown in FIG. 5 and FIG. 6 in the case of a gain of 1V/100 A.

FIG. 8A is a schematic diagram illustrating an input voltage and a current flowing through a GC in the gradient amplifier shown in FIG. 5 and FIG. 6 in the case of a gain of 1V/100 A. By comparing to FIG. 4A, it can be seen that the ripple of the current I4 output from the gradient amplifier shown in FIG. 5 and FIG. 6 to the GC in the case of the same gain condition and the same input voltage, is obviously reduced.

Figure 8B:
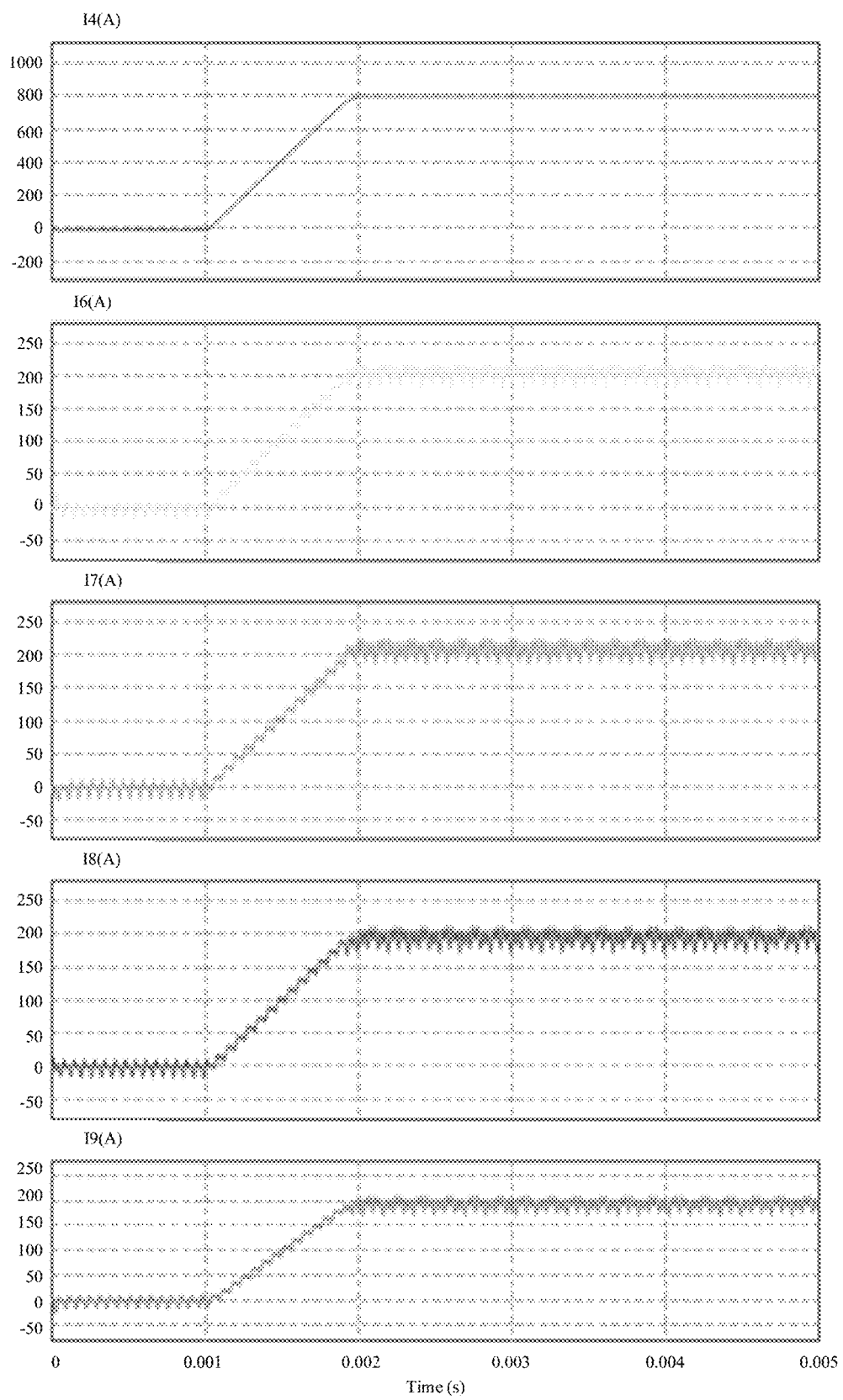
FIG. 8B is a schematic diagram illustrating a current flowing through the gradient coil of the gradient amplifier shown in FIG. 5 and FIG. 6 and a current flowing from each of the working half-bridges in the gradient amplifier shown in FIG. 5 and FIG. 6 into the gradient coil.

Referring to FIG. 8B, the current I4 flows through the GC, and the currents I6, I7, I8 and I9 respectively flow through the inductors 643, 633, 623 and 613 coupled between the working half-bridges 541, 531, 521 and 511 and the GC. In other words, the currents I6, I7, I8 and I9 respectively flow from the working half-bridges 541, 531, 521 and 511 into the GC. By comparing to FIG. 4A, it can be seen that ripples of the currents I6, I7, I8 and I9 flowing through the inductors 643, 633, 623 and 613 in the gradient amplifier shown in FIG. 5 and FIG. 6 are nearly as large as the current I4 flowing through the GC in the gradient amplifier shown in FIG. 2 and FIG. 3. While, the current I4 is a sum of the currents I6, I7, I8 and I9, the ripple of the current I4 is smaller than that of any of the currents I6, I7, I8 and I9 flowing through the inductors 643, 633, 623 and 613.

Figure 8C:
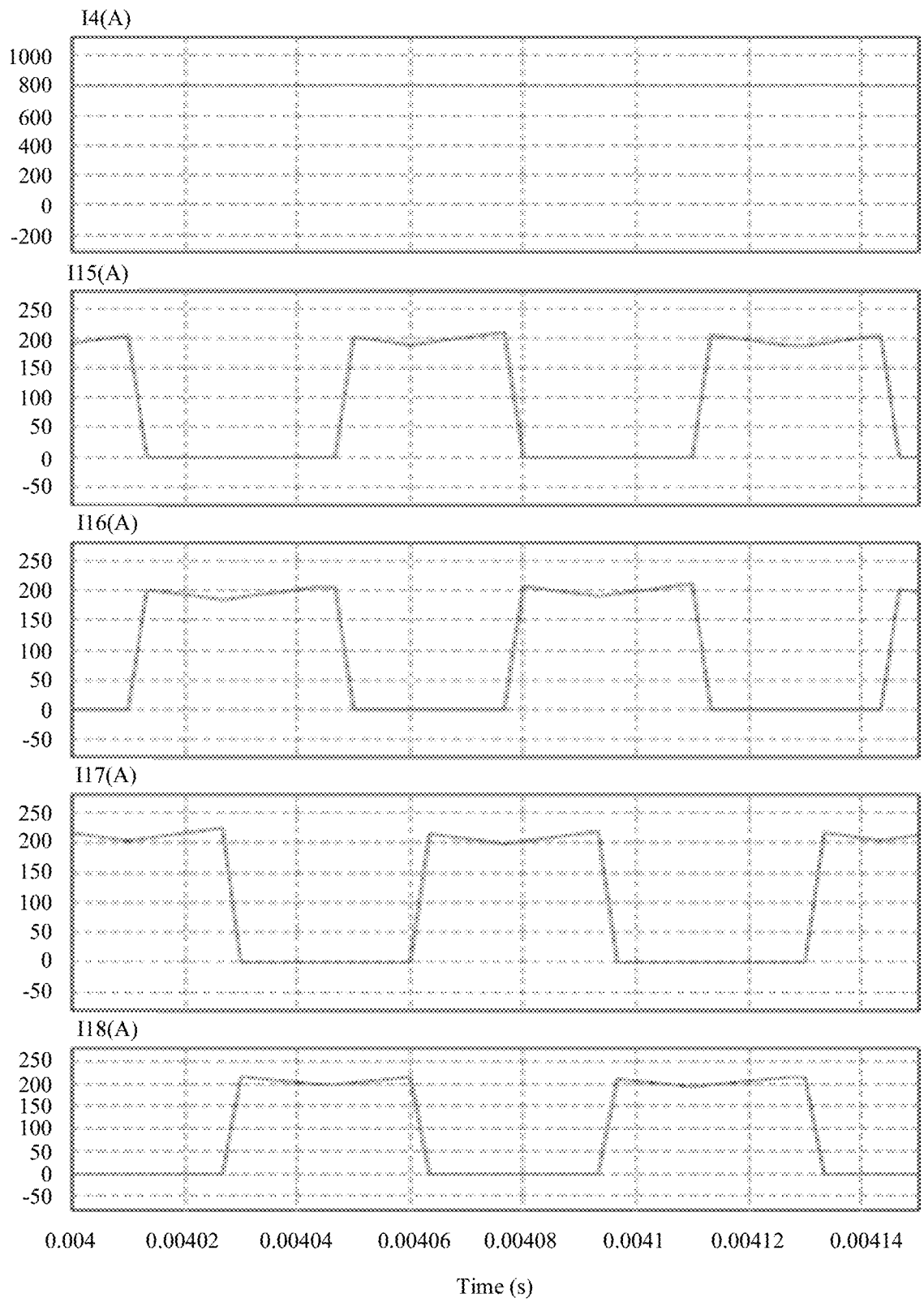
FIG. 8C is a schematic diagram illustrating a current flowing through a gradient coil of the gradient amplifier shown in FIG. 5 and FIG. 6 and a current flowing through each of the freewheeling half-bridge groups in the gradient amplifier shown in FIG. 5 and FIG. 6.

In the gradient amplifier shown in FIG. 5 and FIG. 6, there are totally 2*4 freewheeling half-bridges 551, 552, 561, 562, 571, 572, 581 and 582, and currents flowing through the freewheeling half-bridge groups 551-552, 561-562, 571-572 and 581-582 are marked as I15, I16, I17 and I18, respectively. FIG. 8C is a schematic diagram illustrating the current I4 flowing through the GC and the currents I15, I16, I17 and I18 flowing through the freewheeling half-bridge groups in the freewheeling stage. It can be seen that each of peaks of the currents I15, I16, I17 and I18 flowing through each of the freewheeling half-bridge groups is about ¼ of the peak of the current I4 flowing through the GC, and the current I4 is substantially stable based on a sum of the currents I15, I16, I17 and I18.

It can be seen from FIG. 8B and FIG. 8C that in a case that a working frequency of each of the IGBTs in 2*N half-bridges is f/N. As the sum of the currents flowing through the N half-bridges, the current I4 flowing through the GC may have a frequency of f, thereby significantly reducing the ripple of the current I4 and improving an accuracy of the gradient amplifier. Meanwhile, as the working frequency of each of the IGBTs in each of the half-bridges is 1/N of a main frequency, a switching loss can be greatly decreased.

In conclusion, power density, voltage stress and current stress of each of the IGBTs in each of the half-bridges are significantly reduced by driving the gradient coil with 2*N working half-bridges and 2*N freewheeling half-bridges, so that an IGBT with a lower power density may be used as a power device of the gradient amplifier. Further, the smaller ripple of the current flowing through the GC is, the lower loss and the higher accuracy may be achieved by driving the gradient coil with the freewheeling half-bridges in a manner of shifting a drive signal in phase and dividing the drive signal in frequency. Moreover, as the power device may work at an extremely low working frequency, for example, at a frequency equal to 1/N of the frequency of 2*1 working half-bridges, the switching loss can be further lowered and the reliability can be further improved.

Furthermore, according to an example of the present disclosure, there is also provided a drive circuit of a gradient amplifier, which may be applied to the gradient amplifier including 2*N working half-bridges and 2*N freewheeling half-bridges described in the above examples and configured to generate drive signals for driving the IGBTs in each of the half-bridges in the gradient amplifier. As shown in FIG. 7, the drive circuit may include N−1 phase shifters configured to perform phase shifting of 360*i/N degrees for the original drive signal Sd0. The drive circuit may further include N frequency dividers to divide the frequency of the phase-shifted drive signal by N. As shown in FIG. 7A, dividing a frequency by N may be performed with the PWM circuit and a triangular wave carrier. In conclusion, as shown in FIG. 7 and FIG. 7A, in the case that the gradient amplifier includes 2*N working half-bridges and 2*N freewheeling half-bridges, a drive signal Sdi for driving the IGBTs in each of the working/freewheeling half-bridges may be generated in a manner of phase shifting and frequency division based on the original drive signal Sd0. Where the number i represents a sequence number of a working/freewheeling half-bridge group and is an integer greater than 1 but no more than N. In addition, the specific description for dividing a frequency based on PWM may be referred to any related technology that is well known to those skilled in the art, which is not redundantly described herein.

In an example, a drive circuit of a gradient amplifier including N working half-bridge groups is provided. The circuit includes N−1 first phase shifters and N first frequency dividers. The N−1 first phase shifters are configured to obtain N phase-shifted drive signals Sdpsi by performing phase shifting of 360*(i−1)/N degrees for an original drive signal Sd0 respectively, where i is an integer greater than 1 but no more than N, and the phase-shifted drive signal Sdps1 is the original drive signal Sd0. The N first frequency dividers are configured to obtain a drive signal Sdi for driving at least one switch in each of the N working half-bridge groups by dividing a frequency of each of the phase-shifted drive signals Sdpsi by N.

In an example, each of the first frequency dividers includes a first PWM circuit. A signal input end of the first PWM circuit is configured to receive the phase-shifted drive signal Sdpsi. The first PWM circuit is configured to modulate the phase-shifted drive signal Sdpsi with the first triangular wave carrier Sc such that the drive signal Sdi with a frequency equal to 1/N of a frequency of the original drive signal Sd0 is generated.

In an example, the gradient amplifier including N working half-bridge groups may further include N freewheeling half-bridge groups. The drive circuit further includes N−1 second phase shifters and N second frequency dividers. The N−1 second phase shifters are configured to obtain N phase-shifted freewheeling drive signals Scdpsi by performing phase shifting of 360*(i−1)/N degrees for an original freewheeling drive signal Scd0 respectively, where the phase-shifted freewheeling drive signal Scdps1 is the original freewheeling drive signal Scd0. The N second frequency dividers are configured to obtain a freewheeling drive signal Scdi for driving at least one switch in each of the N freewheeling half-bridge groups by dividing a frequency of the phase-shifted freewheeling drive signal Scdpsi by N.

In an example, each of the second frequency dividers includes a second PWM circuit. A signal input end of the second PWM circuit is configured to receive the phase-shifted freewheeling drive signal Scdpsi. A carrier input end of the second PWM circuit configured to receive a second triangular wave carrier Scc. The second PWM circuit is configured to modulate the phase-shifted freewheeling drive signal Scdpsi with the second triangular wave carrier Scc such that the freewheeling drive signal Scdi with a frequency equal to 1/N of a frequency of the original freewheeling drive signal Scd0 is generated.

It should be noted that the above examples of the present disclosure is described progressively, with emphasis on its difference from other examples, and those similar parts among different examples can be referred to each other At last, it shall be noted that the relational terms such as "first" and "second" used herein are merely intended to distinguish one entity or operation from another entity or operation rather than to require or imply any such actual relation or order existing between these entities or operations. Also, the term "including", "containing" or any variation thereof is intended to encompass non-exclusive inclusion, so that a process, method, article or device including a series of elements includes not only those elements but also other elements not listed explicitly or those elements inherent to such a process, method, article or device. Without more limitations, an element defined by the statement "including a . . . " shall not be precluded to include additional same elements present in a process, method, article or device including the elements.

The above are detailed descriptions of a gradient amplifier and a drive circuit thereof provided by the present disclosure. The examples of the present disclosure are described in details as above so that those skilled in the art can realize or use the present disclosure. Various modifications to these examples will be readily apparent to those skilled in the art, and the generic principles defined herein may be practiced in other examples without departing from the spirit or scope of the present disclosure. Thus, the present disclosure is not intended to be limited to these examples shown herein, but comply with the widest scope consistent with the principles and features disclosed herein.

What is claimed is:

1. A gradient amplifier comprising:
   N working half-bridge groups, N being an integer greater than 1, wherein each of the working half-bridge groups comprises:
      a first working half-bridge having a first switch and a second switch, an emitter of the first switch being coupled with a collector of the second switch at a first coupling point; and
      a second working half-bridge having a third switch and a fourth switch, an emitter of the third switch being coupled with a collector of the fourth switch at a second coupling point,
      wherein a gradient coil is coupled between the first coupling point and the second coupling point, and
   wherein each of the working half-bridge groups is configured such that a first current path from a power supply through the first switch, the gradient coil and the fourth switch in succession back to the power supply and a second current path from the power supply through the third switch, the gradient coil and the second switch in succession back to the power supply are formed and a current output from the power supply flows in one of the first current path and the second current path through the gradient coil; and
   N freewheeling half-bridge groups, wherein each of the freewheeling half-bridge groups comprises:
      a first freewheeling half bridge having a fifth switch and a sixth switch, an emitter of the fifth switch being coupled with an emitter of the sixth switch; and
      a second freewheeling half-bridge having a seventh switch and an eighth switch, an emitter of the seventh switch being coupled with an emitter of the eighth switch,
      wherein a collector of the fifth switch is coupled with the second coupling point, a collector of the sixth switch is coupled with a collector of the seventh switch, and a collector of the eighth switch is coupled with the first coupling point.

2. The gradient amplifier according to claim 1, further comprising: for each of the working half-bridge groups,
   a first inductor coupled between the first coupling point and the gradient coil; and
   a second inductor coupled between the second coupling point and the gradient coil.

3. The gradient amplifier according to claim 2, wherein the first inductors of adjacent working half-bridge groups of the working half-bridge groups are configured to couple with each other to obtain first common-mode inductor sets and first differential-mode inductor sets, and
   wherein the second inductors of the adjacent working half-bridge groups are configured to couple with each other to obtain second common-mode inductor sets and second differential-mode inductor sets.

4. The gradient amplifier according to claim 1, wherein, in each of the working half-bridge groups,
   respective gates of the first switch and the fourth switch are coupled with a first drive input end to receive a first drive signal,
   respective gates of the second switch and the third switch are coupled with a second drive input end to receive a second drive signal, and
   the first drive signal and the second drive signal are configured to alternately turn on the first switch and the fourth switch, and the second switch and the third switch.

5. The gradient amplifier according to claim 4, wherein respective drive signals of the N working half-bridge groups are shifted in phase by 360/N degrees in sequence.

6. The gradient amplifier according to claim 1, wherein, in each of the freewheeling half-bridge groups,
   respective gates of the fifth switch and the seventh switch are coupled with a first freewheeling drive input end to receive a first freewheeling drive signal,
   respective gates of the sixth switch and the eighth switch are coupled with a second freewheeling drive input end to receive a second freewheeling drive signal, and
   the first freewheeling drive signal and the second freewheeling drive signal are configured to alternatively turn on the fifth switch and the seventh switch, and the eighth switch and the sixth switch.

7. The gradient amplifier according to claim 6, wherein respective freewheeling drive signals of the N freewheeling half-bridge groups are shifted in phase by 360/N degrees in sequence.

8. The gradient amplifier according to claim 1, wherein the working half-bridge groups are configured such that the current paths of the working half-bridge groups are in parallel through the gradient coil, and a current of the gradient coil is a sum of the currents flowing in the current paths through the gradient coil.

9. A drive circuit of a gradient amplifier having N working half-bridge groups, N being an integer greater than 1, the drive circuit comprising:
  N-1 first phase shifters each configured to perform phase shifting of 360*(i-1)/N degree for an original drive signal to obtain a respective phase-shifted drive signal, i being an integer greater than 1 but no more than N, wherein the original drive signal is a phase-shifted drive signal with 0 degree phase shift; and
  N first frequency dividers each configured to divide a frequency of a respective one of the phase-shifted drive signals by N to obtain a respective drive signal for driving at least one switch in a corresponding one of the N working half-bridge groups.

10. The drive circuit according to claim 9, wherein each of the first frequency dividers comprises a first PWM circuit configured to:
  receive a respective phase-shifted drive signal at a signal input end of the first PWM circuit,
  receive a respective first triangular wave carrier at a carrier input end of the first PWM circuit, and
  modulate the respective phase-shifted drive signal with the respective first triangular wave carrier to generate the respective drive signal with a frequency equal to 1/N of the frequency of the respective phase-shifted drive signal that is identical to a frequency of the original drive signal.

11. The drive circuit according to claim 9, wherein the gradient amplifier further comprises N freewheeling half-bridge groups, and
  wherein the drive circuit further comprises:
    N-1 second phase shifters each configured to perform phase shifting of 360*(i-1)/N degree for an original freewheeling drive signal to obtain a respective phase-shifted freewheeling drive signal, wherein the original freewheeling drive signal is a phase-shifted freewheeling drive signal with 0 degree phase shift; and
    N second frequency dividers each configured to drive a frequency of a respective one of the phase-shifted freewheeling drive signals by N to obtain a respective freewheeling drive signal for driving at least one switch in a corresponding one of the N freewheeling half-bridge groups.

12. The drive circuit according to claim 11, wherein each of the second frequency dividers comprises a second PWM circuit configured to:
  receive a respective phase-shifted freewheeling drive signal at a signal input end of the second PWM circuit,
  receive a respective second triangular wave carrier at a carrier input end of the second PWM circuit, and
  modulate the respective phase-shifted freewheeling drive signal with the respective second triangular wave carrier to generate the respective freewheeling drive signal with a frequency equal to 1/N of the frequency of the respective phase-shifted freewheeling drive signal that is identical to a frequency of the original freewheeling drive signal.

13. A gradient system of a nuclear magnetic resonance imaging (MM) system, the gradient system comprising:
  a gradient amplifier including:
    N working half-bridge groups, N being an integer greater than 1, wherein each of the working half-bridge groups comprises:
      a first working half-bridge having a first switch and a second switch, an emitter of the first switch being coupled with a collector of the second switch at a first coupling point; and
      a second working half-bridge having a third switch and a fourth switch, an emitter of the third switch being coupled with a collector of the fourth switch at a second coupling point; and
    N freewheeling half-bridge groups, wherein each of the freewheeling half-bridge groups comprises:
      a first freewheeling half bridge having a fifth switch and a sixth switch, an emitter of the fifth switch being coupled with an emitter of the sixth switch; and
      a second freewheeling half-bridge having a seventh switch and an eighth switch, an emitter of the seventh switch being coupled with an emitter of the eighth switch,
      wherein a collector of the fifth switch is coupled with the second coupling point, a collector of the sixth switch is coupled with a collector of the seventh switch, and a collector of the eighth switch is coupled with the first coupling point; and
    a gradient coil coupled between the first coupling point and the second coupling point,
    wherein the gradient amplifier is configured such that a current flowing through the gradient coil is a sum of currents flowing through the N working half-bridge groups.

14. The gradient system according to claim 13, wherein each of the working half-bridge groups is configured such that a first current path from a power supply through the first switch, the gradient coil and the fourth switch in succession back to the power supply and a second current path from the power supply through the third switch, the gradient coil and the second switch in succession back to the power supply are formed, and a current output from the power supply flows in one of the first current path and the second current path through the gradient coil.

15. The gradient system according to claim 13, further comprising a driving circuit for the N working half-bridge groups, the driving circuit including:
  N-1 first phase shifters each configured to perform phase shifting of 360*(i-1)/N degree for an original drive signal to obtain a respective phase-shifted drive signal, i being an integer greater than 1 but no more than N, wherein the original drive signal is a phase-shifted drive signal with 0 degree phase shift; and
  N first frequency dividers each configured to divide a frequency of a respective one of the phase-shifted drive signals by N to obtain a respective drive signal for driving at least one switch in a corresponding one of the N working half-bridge groups.

16. The gradient system according to claim 13,
  wherein, in each of the working half-bridge groups,
    respective gates of the first switch and the fourth switch are coupled with a first drive input end to receive a first drive signal, respective gates of the second switch and the third switch are coupled with a second drive input end to receive a second drive signal, and the first drive signal and the second drive signal are configured to alternately turn on the first switch and the fourth switch, and the second switch and the third switch, and wherein respective drive signals of the N working half-bridge groups are shifted in phase by 360/N degrees in sequence.

17. The gradient system according to claim 13, further comprising a drive circuit for the N freewheeling half-bridge groups, the drive circuit including:

N-1 second phase shifters each configured to perform phase shifting of 360*(i-1)/N degree for an original freewheeling drive signal to obtain a respective phase-shifted freewheeling drive signal, wherein the original freewheeling drive signal is a phase-shifted freewheeling drive signal with 0 degree phase shift; and N second frequency dividers each configured to drive a frequency of a respective one of the phase-shifted freewheeling drive signals by N to obtain a respective freewheeling drive signal for driving at least one switch in a corresponding one of the N freewheeling half-bridge groups.

18. The gradient system according to claim 13, wherein, in each of the freewheeling half-bridge groups, respective gates of the fifth switch and the seventh switch are coupled with a first freewheeling drive input end to receive a first freewheeling drive signal, respective gates of the sixth switch and the eighth switch are coupled with a second freewheeling drive input end to receive a second freewheeling drive signal, and the first freewheeling drive signal and the second freewheeling drive signal are configured to alternatively turn on the fifth switch and the seventh switch, and the eighth switch and the sixth switch, and wherein respective freewheeling drive signals of the N freewheeling half-bridge groups are shifted in phase by 360/N degrees in sequence.

* * * * *